United States Patent
Tsuto

(10) Patent No.: US 12,009,189 B2
(45) Date of Patent: Jun. 11, 2024

(54) METHOD FOR CONTROLLING CLEANING AND PLASMA PROCESSING APPARATUS

(71) Applicant: Tokyo Electron Limited, Tokyo (JP)

(72) Inventor: Takashi Tsuto, Hillsboro, OR (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/748,446

(22) Filed: May 19, 2022

(65) Prior Publication Data

US 2022/0384162 A1 Dec. 1, 2022

(30) Foreign Application Priority Data

May 27, 2021 (JP) .................................. 2021-089005

(51) Int. Cl.
| | | |
|---|---|---|
| *H01J 37/32* | (2006.01) | |
| *B08B 7/00* | (2006.01) | |
| *B08B 13/00* | (2006.01) | |

(52) U.S. Cl.
CPC ...... *H01J 37/32862* (2013.01); *B08B 7/0035* (2013.01); *B08B 13/00* (2013.01); *H01J 37/32642* (2013.01); *H01J 37/32091* (2013.01); *H01J 2237/24564* (2013.01)

(58) Field of Classification Search
CPC ........... H01J 37/32862; H01J 37/32642; H01J 37/32091; H01J 2237/24564; H01J 37/32935; H01J 37/32715; B08B 7/0035; B08B 13/00

See application file for complete search history.

(56) References Cited

U.S. PATENT DOCUMENTS

| | | | | |
|---|---|---|---|---|
| 2004/0007560 A1* | 1/2004 | Sakano | ................... | H01L 22/20 257/E21.252 |
| 2006/0216406 A1* | 9/2006 | Hudson | ............. | H01J 37/32963 118/712 |
| 2009/0242127 A1* | 10/2009 | Koshimizu | ....... | H01J 37/32697 156/345.47 |
| 2010/0304572 A1* | 12/2010 | Koshimizu | ....... | H01J 37/32642 156/345.28 |
| 2018/0366305 A1* | 12/2018 | Nagami | ............ | H01J 37/32706 |
| 2020/0152428 A1* | 5/2020 | Sasaki | ............... | H01J 37/32091 |

FOREIGN PATENT DOCUMENTS

| | | |
|---|---|---|
| JP | 2019-169635 A | 10/2019 |
| JP | 2019-201047 A | 11/2019 |

* cited by examiner

*Primary Examiner* — Erin F Bergner

(74) *Attorney, Agent, or Firm* — XSENSUS LLP

(57) ABSTRACT

A method for controlling cleaning of an inner surface of a chamber of a plasma processing apparatus is provided. The method comprises; processing a substrate using plasma generated in the chamber, the substrate being disposed on a substrate support in the chamber and in a region surrounded by an edge ring placed on the substrate support and to which a DC voltage is applied during the plasma generation; measuring a self-bias potential of the edge ring during the plasma generation in said processing the substrate; and controlling the cleaning of the inner surface of the chamber in response to the self-bias potential.

16 Claims, 4 Drawing Sheets

METHOD FOR CONTROLLING CLEANING AND PLASMA PROCESSING APPARATUS

CROSS-REFERENCE TO RELATED APPLICATIONS

This application claims priority to Japanese Patent Application No. 2021-089005 filed on May 27, 2021, the entire contents of which are incorporated herein by reference.

TECHNICAL FIELD

Exemplary embodiments of the present disclosure relate to a method for controlling cleaning and a plasma processing apparatus.

BACKGROUND

A plasma processing apparatus is used for performing plasma processing on a substrate. When the plasma processing is performed on the substrate using a plasma processing apparatus, deposits such as reaction products and the like are formed on an inner surface of a chamber. The deposits affect the processing of the substrate, and thus are removed by cleaning. Such cleaning is disclosed in Japanese Patent Application Publication Nos. 2019-201047 and 2019-169635.

SUMMARY

The present disclosure provides a technique for controlling cleaning in response to conditions of an inner surface of a chamber of a plasma processing apparatus.

In accordance with an aspect of the present disclosure, there is provided a method for controlling cleaning of an inner surface of a chamber of a plasma processing apparatus, comprising: processing a substrate using plasma generated in the chamber, the substrate being disposed on a substrate support in the chamber and in a region surrounded by an edge ring placed on the substrate support and to which a DC voltage is applied during the plasma generation; measuring a self-bias potential of the edge ring during the plasma generation in said processing the substrate; and controlling the cleaning of the inner surface of the chamber in response to the self-bias potential.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
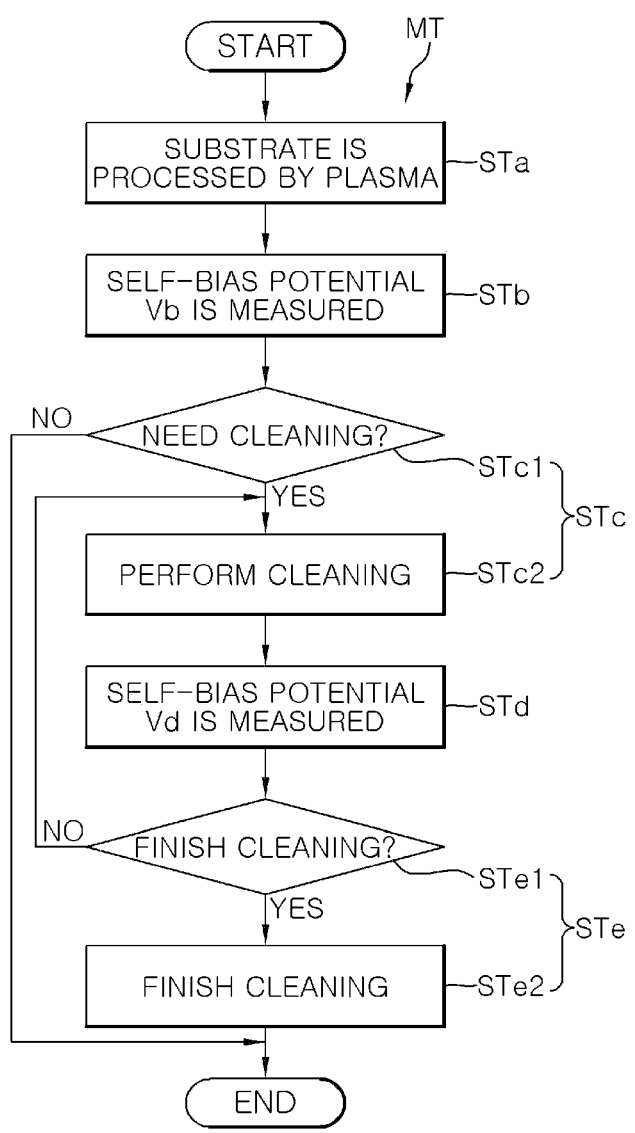
FIG. 1 is a flowchart of a method for controlling cleaning according to one exemplary embodiment.

Hereinafter, various exemplary embodiments will be described.

In one exemplary aspect, a method for controlling cleaning of an inner surface of a chamber of a plasma processing apparatus may be provided. The method may include processing a substrate using plasma generated in the chamber. The substrate is disposed on a substrate support in the chamber and in a region surrounded by an edge ring placed on the substrate support. A DC voltage is applied to the edge ring during the plasma generation. The method may further include measuring a self-bias potential of the edge ring during the plasma generation in said processing the substrate. The method may still further include controlling the cleaning of the inner surface of the chamber in response to the self-bias potential.

When the substrate is being processed by plasma, deposits are adhered to the edge ring disposed around the substrate. The self-bias potential of the edge ring during the plasma generation changes due to the adhesion of the deposits on the edge ring. Therefore, the self-bias potential of the edge ring during the plasma generation reflects the state of the inner surface of the chamber of the plasma processing apparatus. Accordingly, in accordance with the above embodiment, it is possible to control the cleaning in response to the state of the inner surface of the chamber of the plasma processing apparatus.

In another aspect, the controlling the cleaning may include determining whether or not the cleaning is necessary by comparing the self-bias potential with a threshold value. The controlling the cleaning may further include performing the cleaning when it is determined that the cleaning is necessary.

In still another aspect, the method may further include determining whether or not the cleaning needs to be completed. Whether or not the cleaning needs to be completed is determined by comparing the self-bias potential of the edge ring measured during the cleaning using the plasma generated in the chamber with the threshold value. The method may still further include completing the cleaning when it is determined that the cleaning needs to be completed.

In another still still further aspect, the DC voltage may be applied to the edge ring via a conductor portion extending along an outer periphery of the edge ring.

In another further aspect, the self-bias potential may be measured when the application of the DC voltage is stopped.

In still another further aspect, a plasma processing apparatus may be provided. The apparatus may includes a chamber, a substrate support, a plasma generator, a DC power supply, a sensor and a controller. The substrate support may be disposed in the chamber and configured to support a substrate and an edge ring placed thereon. The plasma generator may be configured to generate plasma in the chamber. The DC power supply may be configured to apply a DC voltage to the edge ring. The sensor may be configured to measure a self-bias potential of the edge ring. The controller may be configured to control the plasma generator to generate plasma in the chamber in order to process the substrate disposed on the substrate support and in a region surrounded by the edge ring. The controller may be configured to control the DC power supply to apply a DC voltage to the edge ring when the plasma is generated in the chamber to process the substrate. The controller may be configured to to control the cleaning of an inner surface of the chamber in response to a self-bias potential of the edge ring measured by the sensor when the plasma is generated in the chamber to process the substrate.

In still another further aspect, the controller may be configured to execute control for performing the cleaning when it is determined that the cleaning is required by comparing the self-bias potential with the threshold value.

In another still further aspect, the controller may be configured to complete the cleaning when it is determined the cleaning needs to be completed. Whether or not the cleaning needs to be completed may be determined by comparing the self-bias potential of the edge ring measured during the cleaning performed using the plasma generated in the chamber with the threshold value.

In yet another aspect, the plasma processing apparatus may further include a conductor portion extending along the outer periphery of the edge ring. The DC power supply may be electrically coupled to the edge ring through the conductor portion to apply the DC voltage to the edge ring through the conductor portion.

In yet still another aspect, the controller may be configured to use the self-bias potential measured by the sensor in a state where the application of the DC voltage is stopped when the plasma is generated in the chamber to process the substrate.

Hereinafter, various exemplary embodiments will be described in detail with reference to the accompanying drawings. Like reference numerals will be used for like or corresponding parts throughout the drawings.

FIG. 1 is a flowchart of a method for controlling cleaning according to one embodiment. A method MT shown in FIG. 1 is performed to control cleaning of an inner surface of a chamber of a plasma processing apparatus.

Figure 2:
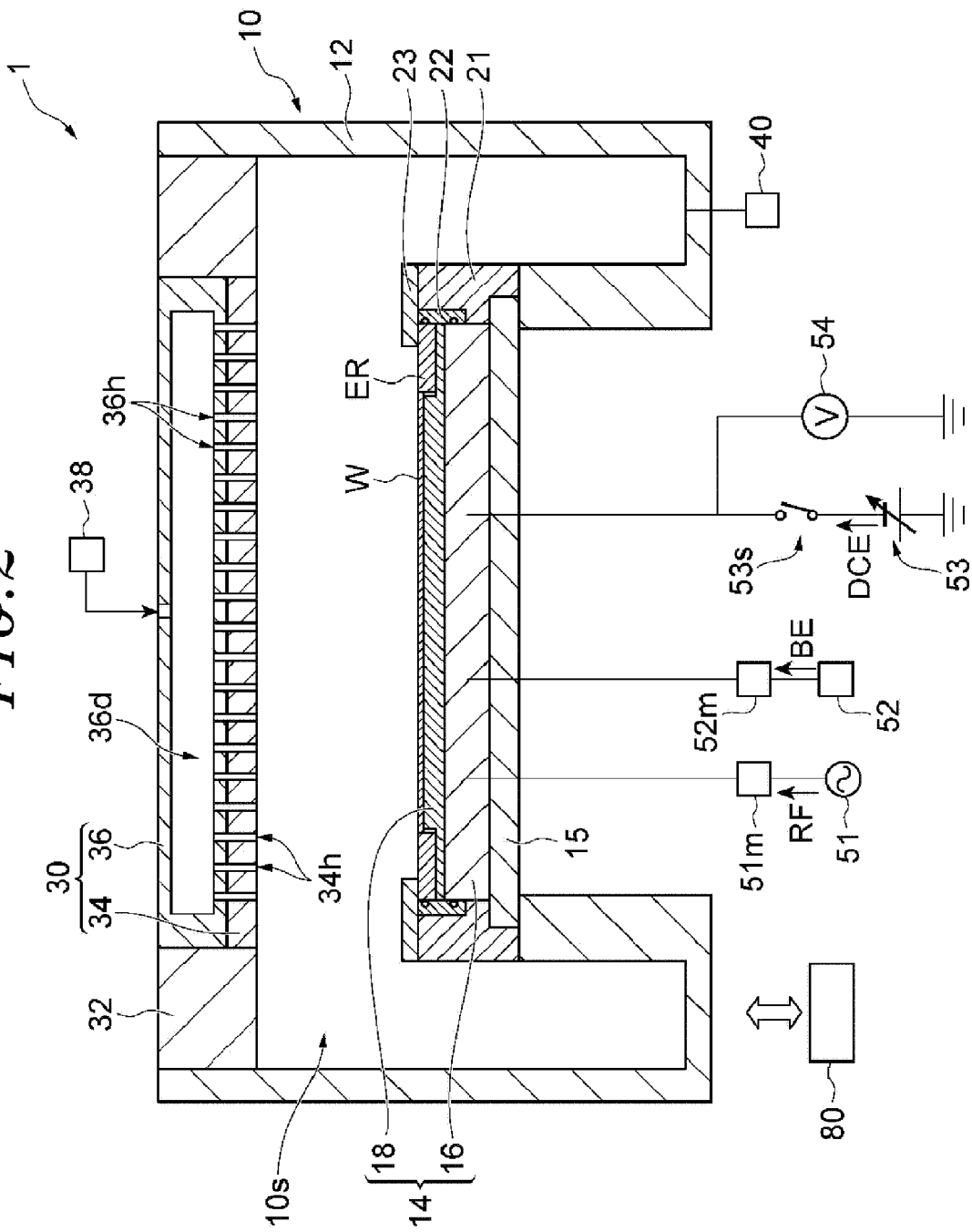
FIG. 2 schematically shows a plasma processing apparatus according to one exemplary embodiment.
Figure 3:
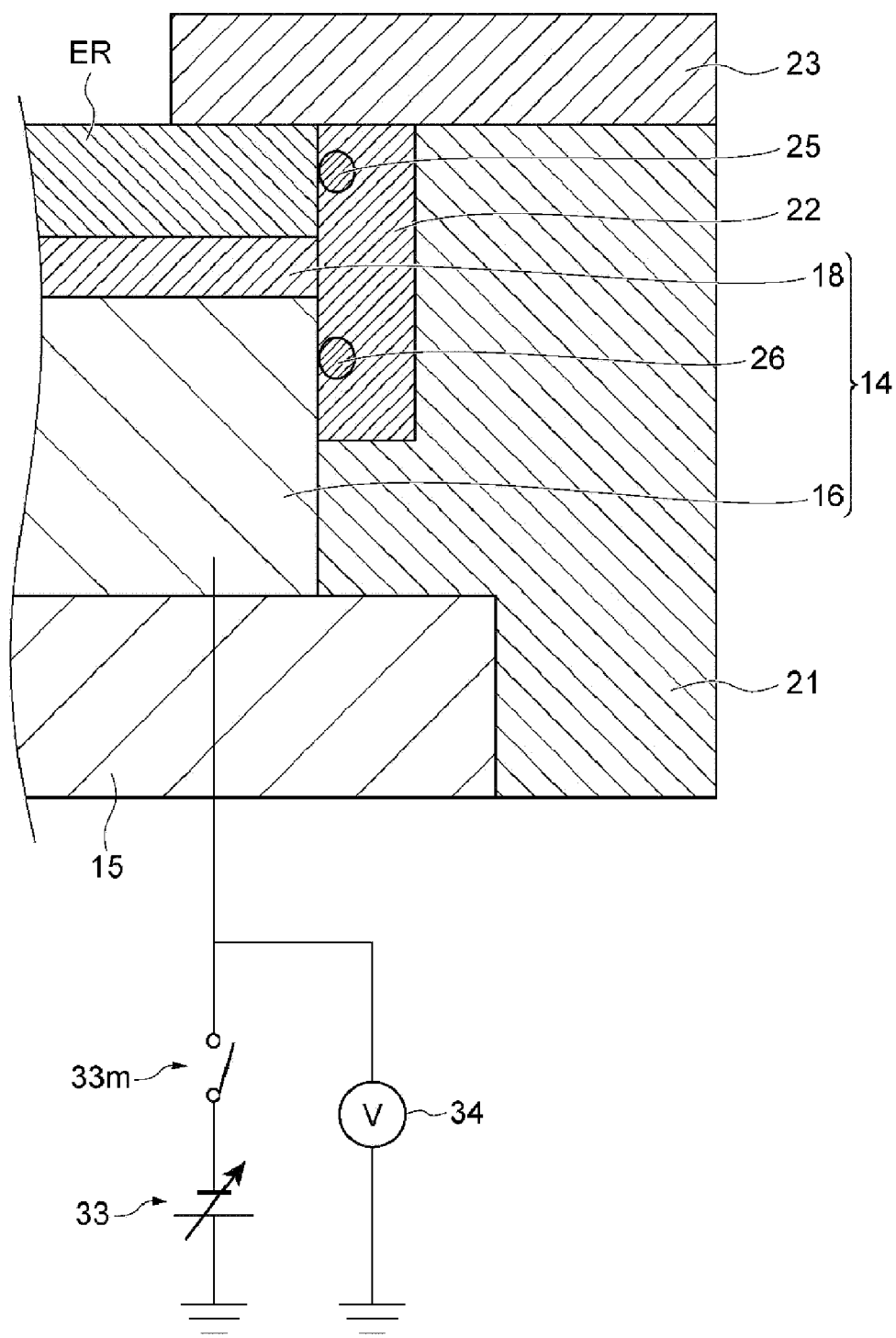
FIG. 3 is a partially enlarged cross-sectional view of a plasma processing apparatus according to one exemplary embodiment.

FIG. 2 schematically shows a plasma processing apparatus according to one exemplary embodiment. FIG. 3 is a partially enlarged cross-sectional view of a plasma processing apparatus according to one exemplary embodiment. The method MT can be applied to the plasma processing apparatus 1 shown in FIGS. 2 and 3.

The plasma processing apparatus 1 is a capacitively coupled plasma processing apparatus. The plasma processing apparatus 1 includes a chamber 10. The chamber 10 has an inner space 10s. In one embodiment, the chamber 10 may include a chamber body 12. The chamber body 12 has a substantially cylindrical shape. The inner space 10s is disposed in the chamber body 12. The chamber body 12 is made of, e.g., aluminum. The chamber body 12 is electrically grounded. A plasma-resistant film is formed on an inner wall of the chamber body 12, i.e., a wall that defines the inner space 10s. The plasma-resistant film may be a film formed by anodic oxidation treatment or a ceramic film made of yttrium oxide.

The plasma processing apparatus 1 further includes a substrate support 14. The substrate support 14 is disposed in the chamber 10 and is configured to support the substrate W placed on the substrate support 14. The substrate W has a substantially disc shape.

The substrate support 14 is configured to further support an edge ring ER placed on the substrate support 14. The edge ring ER has a ring shape and is made of a material such as silicon or silicon carbide. The substrate W is disposed on the substrate support 14 and in a region surrounded by the edge ring ER.

The substrate support 14 may include a base 16 and an electrostatic chuck 18. The base 16 is made of a metal such as aluminum and has a substantially disc shape. In one embodiment, the base 16 may be disposed on a bottom plate 15 or may be supported by a bottom portion of the chamber 10 via the bottom plate 15. The bottom plate 15 is made of an insulating material such as quartz or aluminum oxide.

The electrostatic chuck 18 is disposed on the base 16. The electrostatic chuck 18 is configured to hold the substrate W by an electrostatic attractive force generated between the substrate W placed on the electrostatic chuck 18 and the electrostatic chuck 18. The electrostatic chuck 18 may be configured to further hold the edge ring ER placed thereon.

In one embodiment, a member 21 may be disposed along the outer peripheries of the base 16 and the electrostatic chuck 18. The member 21 is made of an insulating material such as quartz and covers the outer peripheries of the base 16 and the electrostatic chuck 18.

In one embodiment, a conductor portion 22 may extend along the outer circumference of the edge ring ER. The conductor portion 22 is made of a conductor such as aluminum. The conductor portion 22 may have a ring shape. A DC voltage DCE to be described later is applied from the outer periphery of the edge ring ER to the edge ring ER via the conductor portion 22. The DC voltage DCE may be applied to the edge ring ER via the base 16 and the conductor portion 22. A part of the conductor portion 22 may be in direct or indirect contact with the outer circumference of the edge ring ER. For example, the inner peripheral surface of the upper end portion of the conductor portion 22 may be in contact with the outer periphery of the edge ring ER with a member 25 interposed therebetween. Further, another part of the conductor portion may be in direct or indirect contact with the outer periphery of the base 16. For example, the inner peripheral surface of the lower end portion of the conductor portion 22 may be in contact with the outer periphery of the base 16 with a member 26 interposed therebetween. Each of the member 25 and the member 26 has elasticity and is made of a conductor.

The conductor portion 22 may extend along the outer peripheries of the base 16, the electrostatic chuck 18, and the edge ring Er, and may be covered by the member 21. Further, the upper end of the conductor portion 22 may be covered with a cover ring 23. The cover ring 23 is made of an insulating material such as quartz, and extends on the outer edges of the member 21, the conductor 22, and the edge ring ER.

The plasma processing apparatus 1 further includes an upper electrode 30. The upper electrode 30 is disposed above the substrate support 14. The upper electrode 30 closes an upper opening of the chamber body 12 together with a member 32. The member 32 is made of an insulating material. The upper electrode 30 is supported at an upper portion of the chamber body 12 via the member 32.

The upper electrode 30 includes a ceiling plate 34 and a holder 36. The bottom surface of the ceiling plate 34 defines the inner space 10s. The ceiling plate 34 has a plurality of gas holes 34h. The gas holes 34h penetrate through the ceiling plate 34 in a plate thickness direction (vertical direction). The ceiling plate 34 is made of, e.g., silicon. Alternatively, the ceiling plate 34 may have a structure in which a plasma-resistant film is formed on a surface of an aluminum member. The plasma-resistant film may be an insulating film such as a film formed by anodic oxidation treatment or a film made of yttrium oxide.

The holder 36 detachably holds the ceiling plate 34. The holder 36 is made of a metal such as aluminum. The holder 36 has therein a gas diffusion space 36d. Further, the holder 36 has a plurality of gas holes 36h. The gas holes 36h extend downward from the gas diffusion space 36d to communicate with the gas holes 34h, respectively. A gas supplier 38 is connected to the gas diffusion space 36d. The gas supplier 38 is configured to supply a gas such as a processing gas or a cleaning gas into the chamber 10.

The plasma processing apparatus 1 further includes an exhaust device 40. The exhaust device 40 has a pressure controller such as an automatic pressure control valve and a vacuum pump such as a turbo molecular pump or the like, and can reduce a pressure in the inner space 10s.

Figure 4:
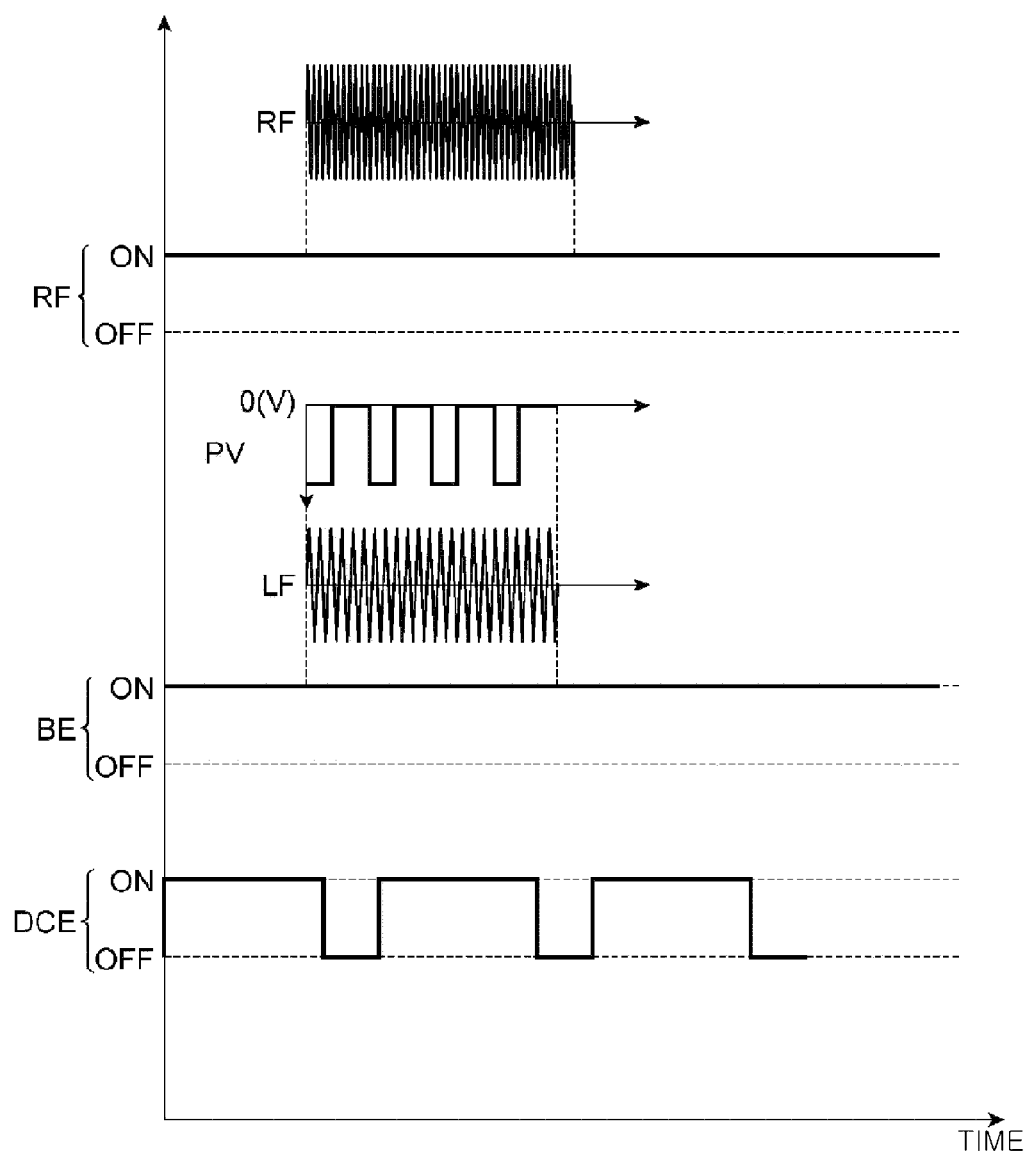
FIG. 4 shows an example of each of a radio frequency power RF, a bias energy BE, and a DC voltage DCE.

The plasma processing apparatus 1 further includes a radio frequency power supply 51. The radio frequency power supply 51 constitutes a plasma generator according to one embodiment. Hereinafter, FIG. 4 will be referred to in addition to FIGS. 2 and 3. FIG. 4 shows an example of each of the radio frequency power RF, a bias energy BE, and the DC voltage DCE. In FIG. 4, "ON" of the radio frequency power RF indicates that the radio frequency power RF is being supplied, and "OFF" of the radio frequency power RF indicates that the supply of the radio frequency power RF is stopped. Further, "ON" of the bias energy BE indicates that the bias energy BE is being supplied, and "OFF" of the bias energy BE indicates that the supply of the bias energy BE is stopped. Further, "ON" of the DC voltage DCE indicates that the DC voltage DCE is being applied to the edge ring ER, and "OFF" of the DC voltage DCE indicates that the application of the DC voltage DCE to the edge ring ER is stopped.

The radio frequency power supply 51 generates the radio frequency power RF for plasma generation. The radio frequency power RF has a frequency within a range of 27 MHz to 100 MHz, e.g., 40 MHz or 60 MHz. The radio frequency power supply 51 is electrically coupled to the electrode in the substrate support 14 through a matching device 51m. In one embodiment, the radio frequency power supply 51 may be electrically coupled to the base 16 through the matching device 51m. Alternatively, the radio frequency power supply 51 may be electrically coupled to the upper electrode 30 through the matching device 51m. The matching device 51m has a matching circuit for matching an impedance on a load side of the radio frequency power supply 51 with an output impedance of the radio frequency power supply 51. The radio frequency power RF generates a radio frequency electric field in the chamber 10. Plasma is produced from the gas in chamber 10 by the radio frequency electric field thus generated.

In one embodiment, the plasma processing apparatus 1 may further include a bias power supply 52. The bias power supply 52 is configured to generate the bias energy BE for attracting ions in the plasma to the substrate W. The bias energy is electrical energy. The bias energy BE has a bias frequency. The bias frequency is lower than the frequency of the radio frequency power RF, and is within a range of 100 kHz to 13.56 MHz.

In one embodiment, the bias energy BE may be a radio frequency power having a bias frequency, i.e., a radio frequency bias power LF. In this case, the bias power supply 52 is electrically coupled to the electrode in the substrate support 14 through a matching device 52m. For example, the bias power supply 52 is electrically coupled to the base 16 through the matching device 52m. The matching device 52m has a matching circuit for matching an impedance on a load side of the bias power supply 52 with an output impedance of the bias power supply 52.

In another embodiment, the bias energy BE may be a pulse PV of a voltage periodically applied at a time interval that is a reciprocal of the bias frequency. The pulse PV of the voltage has a positive polarity or a negative polarity. The pulse of the voltage may be a negative DC voltage pulse. The pulse of the voltage may have any waveform such as a square wave, a triangular wave, or an impulse wave.

The plasma processing apparatus 1 further includes a DC power supply 53. The DC power supply 53 is configured to generate the above-described DC voltage DCE. The DC power supply 53 is electrically coupled to the edge ring ER through a switch 53s. The DC power supply 53 may be electrically coupled to the edge ring ER through the switch 53s, the base 16, and the conductor portion 22.

The plasma processing apparatus 1 further includes a sensor 54. The sensor 54 is a voltage sensor and is configured to measure the self-bias potential of the edge ring ER. The sensor 54 may directly measure the potential of the edge ring ER or may measure the potential on the electrical path that connects the edge ring ER and the switch 53s. In the illustrated example, the sensor 54 is provided to measure the potential on the electrical path that connects the switch 53s and the base 16.

The plasma processing apparatus 1 further includes a controller 80. The controller 80 is a computer including a processor, a storage device, an input device, a display device, and the like, and controls individual components of the plasma processing apparatus 1. Specifically, the controller 80 executes a control program stored in the storage device and controls the individual components of the plasma processing apparatus 1 based on the recipe data stored in the storage device. The method MT is performed by the plasma processing apparatus 1 under the control of the controller 80.

Hereinafter, the case where the method MT is applied to the plasma processing apparatus 1 will be described as an example with reference to FIG. 1 again. In the method MT, first, step STa is started. Step STa is executed in a state where the substrate W is disposed on the substrate support 14 and in the region surrounded by the edge ring ER. In step STa, the substrate W is processed by the plasma generated in the chamber 10. An example of the processing of the substrate W in step STa is plasma etching, for example.

In step STa, the processing gas is supplied from the gas supplier 38 into the chamber 10. In step STa, a pressure in the chamber 10 is reduced to a specific pressure by the exhaust device 40. In step STa, the radio frequency power RF is supplied by the radio frequency power supply 51 to produce plasma of the processing gas. In step STa, the bias energy BE may be supplied by the bias power supply 52 to attract ions in the plasma toward the substrate W.

Further, in step STa, the DC voltage DCE is applied to the edge ring ER by the DC power supply 53. The voltage level of the DC voltage DCE may be set to reduce or eliminate the difference between the height position of the plasma-sheath interface above the substrate W and the height position of the plasma-sheath interface above the edge ring ER. In step STa, the DC voltage DCE is intermittently set to OFF as shown in FIG. 4. In other words, in step STa, the application of the DC voltage DCE to the edge ring ER is intermittently stopped. Therefore, in step STa, the switch 53s is opened and closed alternately.

In step STa, the gas supplier 38, the exhaust device 40, the radio frequency power supply 51, the bias power supply 52, the DC power supply 53, and the switch 53s are controlled by the controller 80.

Step STb is executed during the period in which step STa is executed. In step STb, a self-bias potential Vb of the edge ring ER is measured by the sensor 54 during the plasma generation in step STa. The self-bias potential Vb is measured when the application of the DC voltage DCE to the edge ring ER is stopped.

In subsequent step STc, the cleaning of the inner surface of the chamber 10 is controlled in response to the self-bias potential Vb measured in step STb. In one embodiment, step STc may include steps STc1 and STc2. In step STc1, it is determined whether or not the inner surface of the chamber 10 needs to be cleaned by comparing the self-bias potential Vb measured in step STb with a threshold value. For example, when the absolute value of the self-bias potential Vb measured in step STb is smaller than or equal to the threshold value, it is determined that the inner surface of the chamber 10 needs to be cleaned. On the other hand, when the absolute value of the self-bias potential measured in step STb is greater than the threshold value, it is determined that it is unnecessary to clean the inner surface of the chamber 10. The determination in step STc1 may be performed by the controller 80.

If it is determined in step STc1 that the cleaning is necessary, the processing proceeds to step STc2. In step STc2, the inner surface of the chamber 10 is cleaned. Step ST c2 may be executed in a state where the substrate W is unloaded from the chamber 10 and no object is placed on the substrate support 14. Alternatively, step STc2 may be executed in a state where the substrate W is unloaded from the chamber 10 and a dummy substrate is placed on the substrate support 14. The cleaning in step STc2 may be performed by producing plasma from the cleaning gas in the chamber 10. The cleaning gas is the gas selected to remove the deposits on the inner surface of the chamber 10. The cleaning gas is, e.g., an oxygen-containing gas such as oxygen gas or CO gas. The cleaning gas may contain one or more other gases.

In step STc2, the cleaning gas is supplied from the gas supplier 38 into the chamber 10. In step STc2, the pressure in the chamber 10 is reduced to a specific pressure by the exhaust device 40. In step STc2, the radio frequency power RF is supplied by the radio frequency power supply 51 to produce plasma from the processing gas in the chamber 10. In step STc2, the bias energy BE may be or may not be supplied by the bias power supply 52. In step STc2, the gas supplier 38, the exhaust device 40, the radio frequency power supply 51, and the bias power supply 52 are controlled by the controller 80.

In one embodiment, the method MT may further include steps STd and STe. Step STd is executed during the period in which step STc2 is executed. In step STd, the self-bias potential Vd of the edge ring ER during the generation of the plasma from the cleaning gas in step STc2 is measured by the sensor 54.

In subsequent step STe, the cleaning in step STc2 is controlled. Step STe includes steps STe1 and STe2. In step STe1, it is determined whether or not the cleaning in step STc2 needs to be completed. The determination in step STe1 is performed by the controller 80. Whether or not the cleaning needs to be completed is determined by comparing the self-bias potential Vd measured in step STd with the threshold value. For example, when the absolute value of the self-bias potential Vd measured in step STd is smaller than or equal to the threshold value, it is determined that it is required to continue the cleaning in step STc2. In this case, steps STc2 and STd are continued.

On the other hand, when the absolute value of the self-bias potential Vd measured in step STd is greater than the threshold value, the cleaning in step STc2 is completed in step STe2. In step STe2, the supply of the cleaning gas and the supply of the radio frequency power RF are stopped. When the bias energy BE is supplied in step STc2, the supply of the bias energy BE is also stopped in step STe2. In step STe2, the gas supplier 38, the radio frequency power supply 51, and the bias power supply 52 are controlled by the controller 80.

When the substrate W is processed by plasma, deposits are adhered to the edge ring ER disposed around the substrate W. The self-bias potential of the edge ring ER during the plasma generation changes due to the adhesion of the deposits to the edge ring ER. Therefore, the self-bias potential of the edge ring ER during the plasma generation reflects the state of the inner surface of the chamber 10 of the plasma processing apparatus 1. Accordingly, in accordance with the method MT, it is possible to control the cleaning in response to the state of the inner surface of the chamber 10 of the plasma processing apparatus 1.

While various embodiments have been described above, the present disclosure is not limited to the above-described embodiments, and various additions, omissions, substitutions and changes may be made. Further, other embodiments can be implemented by combining elements in different embodiments.

For example, the plasma processing apparatus to which the method MT is applied may be a capacitively coupled plasma processing apparatus different from the plasma processing apparatus 1. Further, the plasma processing apparatus to which the method MT is applied may be another type of plasma processing apparatus such as an inductively coupled plasma processing apparatus, an electron cyclotron resonance (ECR) plasma processing apparatus, or a plasma processing apparatus that generates plasma using surface waves such as microwaves.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A method for controlling cleaning of an inner surface of a chamber of a plasma processing apparatus, comprising:
   processing a substrate using plasma generated in the chamber, the substrate being disposed on a substrate support in the chamber and in a region surrounded by an edge ring placed on the substrate support and to which a DC voltage is applied during plasma generation;
   measuring a self-bias potential of the edge ring during the plasma generation in said processing the substrate; and
   controlling the cleaning of the inner surface of the chamber in response to the self-bias potential.

2. The method for controlling cleaning of claim 1, wherein said controlling the cleaning includes:
   determining whether or not the cleaning is necessary by comparing the self-bias potential with a threshold value; and
   performing the cleaning when it is determined that the cleaning is necessary.

3. The method for controlling cleaning of claim 1, further comprising:
   determining whether or not the cleaning needs to be completed by comparing the self-bias potential of the edge ring measured during the cleaning with a threshold value; and
   completing the cleaning when it is determined that the cleaning needs to be completed.

4. The method for controlling cleaning of claim 2, further comprising:

determining whether or not the cleaning needs to be completed by comparing the self-bias potential of the edge ring measured during the cleaning with a threshold value; and completing the cleaning when it is determined that the cleaning needs to be completed.

5. The method for controlling cleaning of claim 1, wherein the DC voltage is applied to the edge ring via a conductor portion extending along an outer periphery of the edge ring.

6. The method for controlling cleaning of claim 2, wherein the DC voltage is applied to the edge ring via a conductor portion extending along an outer periphery of the edge ring.

7. The method for controlling cleaning of claim 1, wherein in said processing the substrate, the self-bias potential is measured when the application of the DC voltage is stopped.

8. The method for controlling cleaning of claim 2, wherein in said processing the substrate, the self-bias potential is measured when the application of the DC voltage is stopped.

9. A plasma processing apparatus comprising:
a chamber;
a substrate support disposed in the chamber and configured to support a substrate and an edge ring placed thereon;
a plasma generator configured to generate plasma in the chamber;
a DC power supply configured to apply a DC voltage to the edge ring;
a sensor configured to measure a self-bias potential of the edge ring; and
a controller configured to control the plasma generator and the DC power supply,
wherein the controller is configured to control the plasma generator to generate plasma in the chamber in order to process the substrate disposed on the substrate support and in a region surrounded by the edge ring, to control the DC power supply to apply a DC voltage to the edge ring when the plasma is generated in the chamber to process the substrate, and to control cleaning of an inner surface of the chamber in response to a self-bias potential of the edge ring measured by the sensor when the plasma is generated in the chamber to process the substrate.

10. The plasma processing apparatus of claim 9, wherein the controller is configured to execute control for performing the cleaning when it is determined that the cleaning is required by comparing the self-bias potential with a threshold value.

11. The plasma processing apparatus of claim 9, wherein the controller is configured to complete the cleaning when it is determined the cleaning needs to be completed by comparing the self-bias potential of the edge ring measured during the cleaning with a threshold value.

12. The plasma processing apparatus of claim 10, wherein the controller is configured to complete the cleaning when it is determined the cleaning needs to be completed by comparing the self-bias potential of the edge ring measured during the cleaning with a threshold value.

13. The plasma processing apparatus of claim 9, further comprising:
a conductor portion extending along an outer periphery of the edge, ring,
wherein the DC power supply is electrically coupled to the edge ring through the conductor portion to apply the DC voltage to the edge ring through the conductor portion.

14. The plasma processing apparatus of claim 10, further comprising:
a conductor portion extending along an outer periphery of the edge ring,
wherein the DC power supply is electrically coupled to the edge ring through the conductor portion to apply the DC voltage to the edge ring through the conductor portion.

15. The plasma processing apparatus of claim 9, wherein the controller is configured to use the self-bias potential measured by the sensor in a state where the application of the DC voltage is stopped when the plasma is generated in the chamber to process the substrate.

16. The plasma processing apparatus of claim 10, wherein the controller is configured to use the self-bias potential measured by the sensor in a state where the application of the DC voltage is stopped when the plasma is generated in the chamber to process the substrate.

* * * * *